United States Patent
Kawashima

(10) Patent No.: US 7,365,478 B2
(45) Date of Patent: Apr. 29, 2008

(54) PIEZOELECTRIC CRYSTAL RESONATOR, PIEZOELECTRIC CRYSTAL UNIT HAVING THE CRYSTAL RESONATOR AND ELECTRONIC APPARATUS HAVING THE CRYSTAL RESONATOR

(75) Inventor: Hirofumi Kawashima, Tokyo (JP)

(73) Assignee: Piedek Technical Laboratory (JP)

( * ) Notice: Subject to any disclaimer, the term of this patent is extended or adjusted under 35 U.S.C. 154(b) by 385 days.

(21) Appl. No.: 11/004,783

(22) Filed: Dec. 3, 2004

(65) Prior Publication Data
US 2005/0134154 A1    Jun. 23, 2005

(30) Foreign Application Priority Data
Dec. 17, 2003    (JP)    ............................. 2003-436628

(51) Int. Cl.
*H01L 41/80* (2006.01)
(52) U.S. Cl. .................................... 310/370
(58) Field of Classification Search ................ 310/370, 310/365, 366, 368, 348, 344; 331/191, 156, 331/107 A; 333/186, 200, 187, 156; H01L 41/08
See application file for complete search history.

(56) References Cited

U.S. PATENT DOCUMENTS

| | | | | |
|---|---|---|---|---|
| 4,178,566 A | * | 12/1979 | Kawashima | 310/370 |
| 4,384,232 A | * | 5/1983 | Debely | 310/370 |
| 6,587,009 B2 | * | 7/2003 | Kitamura et al. | 331/158 |
| 6,897,737 B2 | * | 5/2005 | Sakata et al. | 310/370 |
| 2001/0004226 A1 | * | 6/2001 | Piazza et al. | 310/370 |

* cited by examiner

*Primary Examiner*—Darren Schuberg
*Assistant Examiner*—Karen Beth Addison
(74) *Attorney, Agent, or Firm*—Adams & Wilks

(57) ABSTRACT

A piezoelectric crystal tuning fork resonator comprises a tuning fork base and a plurality of tuning fork tines connected to the tuning fork base, each of the tuning fork tines having opposite main surfaces and side surfaces, a groove having a plurality of stepped portions being formed in at least one of the opposite main surfaces of each of the tuning fork tines, a plurality of first electrodes being disposed on the stepped portions of the groove in at least one of the opposite main surfaces of each of the tuning fork tines, a plurality of second electrodes being disposed on the side surfaces of each of the tuning fork tines, the piezoelectric crystal tuning fork resonator comprising three electrode terminals and each of the three electrode terminals having a different electrical polarity.

20 Claims, 12 Drawing Sheets

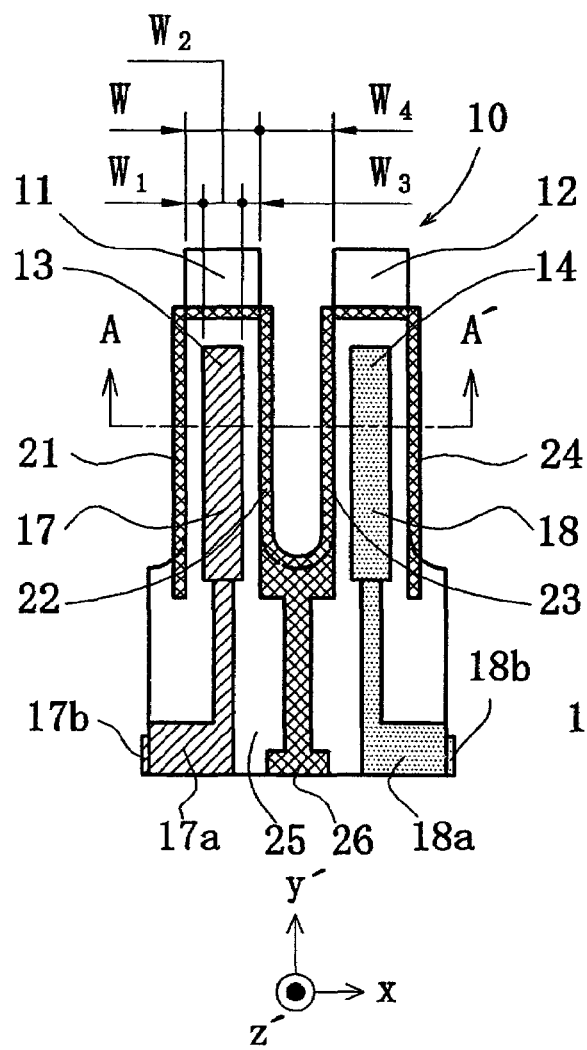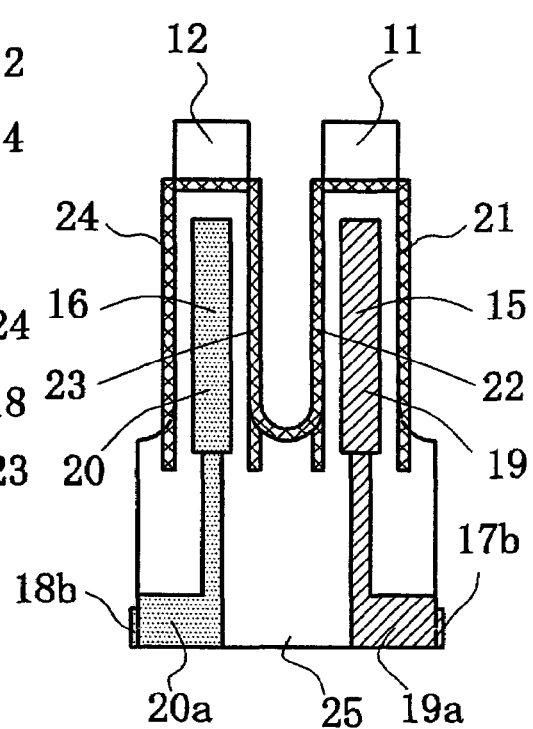
FIG. 1a
FIG. 1b

US 7,365,478 B2

PIEZOELECTRIC CRYSTAL RESONATOR, PIEZOELECTRIC CRYSTAL UNIT HAVING THE CRYSTAL RESONATOR AND ELECTRONIC APPARATUS HAVING THE CRYSTAL RESONATOR

FIELD OF THE INVENTION

The present invention relates to a piezoelectric crystal resonator, a piezoelectric crystal unit having the piezoelectric crystal resonator and an electronic apparatus having the piezoelectric crystal resonator, and more specifically, relates to a piezoelectric crystal resonator made of quartz crystal.

BACKGROUND OF THE INVENTION

There are many electronic apparatus comprising a piezoelectric crystal resonator made of a piezoelectric material such as quartz crystal. For example, cellular phones, wristwatches, facsimiles, digital cameras, digital TV sets, DVD recorders and i-Pods comprising a quartz crystal resonator are well known. Recently, because of high stability for frequency, miniaturization and the light weight nature of these electronic apparatus, the need for an electronic apparatus comprising a smaller quartz crystal resonator with a frequency of high stability has arisen. For example, the quartz crystal resonator having a quartz crystal tuning fork resonator capable of vibrating in a flexural mode housed in a quartz crystal unit and electrically connected to an amplifier, a plurality of capacitors and resistors is widely used as a time standard in an electronic apparatus such as the cellular phones, the wristwatches, the facsimiles, the digital cameras, the digital TV sets, the DVD recorders and the i-Pods.

Heretofore, however, it has been impossible to obtain an electronic apparatus comprising a miniature piezoelectric crystal tuning fork resonator of the prior art, capable of vibrating in a flexural mode, and having a frequency of high stability, a small series resistance and a high quality factor. This is the reason why, when miniaturized, the piezoelectric crystal tuning fork resonator of the prior art, capable of vibrating in a flexural mode has a smaller electromechanical transformation efficiency. As a result of which, the piezoelectric crystal tuning fork resonator has a frequency of low stability, an increased series resistance and a reduced quality factor.

Simultaneously, there has been a big problem in disposing electrodes on tuning fork tines and a tuning fork base of the miniature piezoelectric crystal tuning fork resonator, such that the electrodes disposed to excite the miniature piezoelectric crystal tuning fork resonator can not be connected well and satisfactorily as required.

Additionally, there has been a big problem in a crystal oscillator having the piezoelectric crystal tuning fork resonator of the prior art, such that an oscillation frequency of a fundamental mode of vibration of the piezoelectric crystal tuning fork resonator which is an output signal of the crystal oscillator jumps to a second overtone mode of vibration thereof by shock or vibration.

It is, therefore, a general object of the present invention to provide embodiments of a piezoelectric crystal tuning fork resonator, a piezoelectric crystal unit having the piezoelectric crystal tuning fork resonator and an electronic apparatus having the piezoelectric crystal tuning fork resonator, which overcome or at least mitigate one or more of the above problems.

SUMMARY OF THE INVENTION

The present invention relates to a piezoelectric crystal tuning fork resonator, a piezoelectric crystal unit having the piezoelectric crystal tuning fork resonator and an electronic apparatus having the piezoelectric crystal tuning fork resonator, and in particular, relates to a quartz crystal tuning fork resonator capable of vibrating in a flexural mode of an inverse phase, a quartz crystal unit having the quartz crystal tuning fork resonator and an electronic apparatus having the quartz crystal resonator.

It is an object of the present invention to provide a miniature piezoelectric crystal tuning fork resonator, capable of vibrating in a flexural mode of an inverse phase and having a high electromechanical transformation efficiency.

It is an another object of the present invention to provide a miniature piezoelectric crystal unit having a piezoelectric crystal tuning fork resonator, capable of vibrating in a fundamental mode of vibration of a flexural mode of an inverse phase, and having a high electromechanical transformation efficiency.

It is a further object of the present invention to provide a crystal oscillator having a miniature piezoelectric crystal tuning fork resonator, capable of vibrating in a flexural mode of an inverse phase, and having a frequency of high stability, a small series resistance $R_1$ and a high quality factor $Q_1$.

According to one aspect of the present invention, there is provided a piezoelectric crystal resonator comprising: a piezoelectric crystal tuning fork resonator capable of vibrating in a flexural mode of an inverse phase, the piezoelectric crystal tuning fork resonator comprising a tuning fork base and a plurality of tuning fork tines connected to the tuning fork base, each of the tuning fork tines having opposite main surfaces and side surfaces, the opposite main surfaces having a first main surface and a second main surface opposite the first main surface, the side surfaces having a first side surface and a second side surface opposite the first side surface, at least one groove having a plurality of stepped portions being formed in at least one of the first and second main surfaces of each of the tuning fork tines; in which a plurality of first electrodes are disposed on the stepped portions of the groove in at least one of the first and second main surfaces of each of the tuning fork tines and a plurality of second electrodes are disposed on the first and second side surfaces of each of the tuning fork tines; and in which the piezoelectric crystal tuning fork resonator comprises three electrode terminals and each of the three electrode terminals has a different electrical polarity.

According to a second aspect of the present invention, there is provided a piezoelectric crystal unit comprising: a piezoelectric crystal resonator defined in the one aspect; a case for housing the piezoelectric crystal resonator; and a lid for covering an open end of the case.

According to a third aspect of the present invention, there is provided an electronic apparatus comprising: a piezoelectric crystal resonator defined in the one aspect.

According to a fourth aspect of the present invention, there is provided a piezoelectric crystal resonator comprising: a piezoelectric crystal tuning fork resonator capable of vibrating in a flexural mode of an inverse phase, the piezoelectric crystal tuning fork resonator comprising a tuning fork base and a plurality of tuning fork tines connected to the tuning fork base, each of the tuning fork tines having opposite main surfaces and side surfaces, the opposite main surfaces having a first main surface and a second main surface opposite the first main surface, the side surfaces having a first side surface and a second side surface opposite the first side surface; in which the tuning fork tines have a first tuning fork tine and a second tuning fork tine and a second electrode is disposed on each of first and second side surfaces of each of the first and second tuning fork tines; and in which the second electrodes disposed on the first and second side surfaces of the first tuning fork tine are connected to the second electrodes disposed on the first and second side surfaces of the second tuning fork tine to define a first electrode terminal.

Specifically, one of the three electrode terminals comprises an earth electrode.

Preferably, each of the tuning fork tines has a groove having a first stepped portion and a second stepped portion.

Preferably, each of the tuning fork tines has a through hole.

The present invention will be more fully understood by referring to the following detailed specification and claims taken in connection with the appended drawings.

BRIEF DESCRIPTION OF THE DRAWINGS

FIG. 1a and FIG. 1b show a top view and a bottom view of a piezoelectric crystal tuning fork resonator of a first embodiment of the present invention;

FIG. 2 shows an A-A' cross-sectional view of the tuning fork tines of the piezoelectric crystal tuning fork resonator in FIG. 1a;

FIG. 4 shows a C-C' cross-sectional view of the tuning fork tines of the piezoelectric crystal tuning fork resonator in FIG. 3a;

DETAILED DESCRIPTION OF THE PREFERRED EMBODIMENTS

Figure 2:
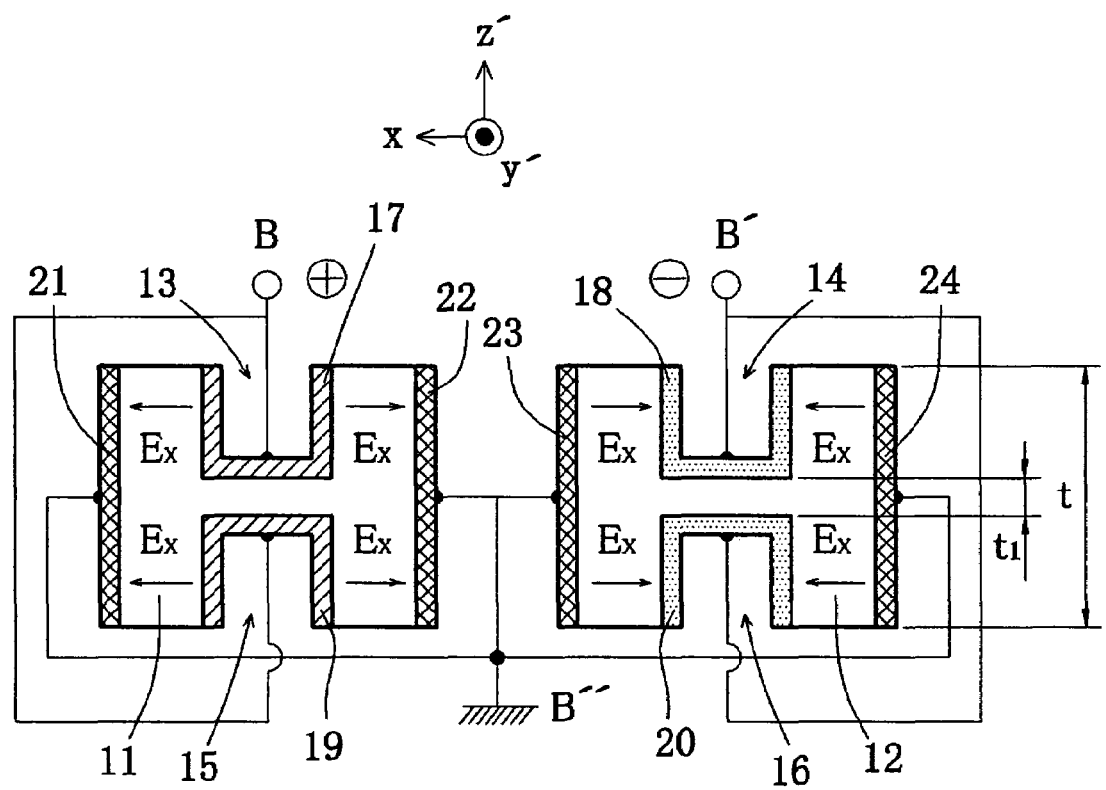

Referring now to the drawings, the embodiments of the present invention will be described in more detail.

FIG. 1a and FIG. 1b show a top view and a bottom view of a piezoelectric crystal tuning fork resonator of a first embodiment of the present invention. The piezoelectric crystal tuning fork resonator 10 comprises a tuning fork base 25 and a plurality of tuning fork tines 11, 12 connected to the tuning fork base 25, and the tuning fork tines comprise a first tuning fork tine 11 and a second tuning fork tine 12. In addition, each of the first and second tuning fork tines 11, 12 has opposite main surfaces and side surfaces, the opposite main surfaces have a first main surface and a second main surface opposite the first main surface and also, the side surfaces have a first side surface and a second side surface opposite the first side surface. In addition, grooves 13, 15 are formed in the first and second main surfaces of the first tuning fork tine 11 and grooves 14, 16 are formed in the first and second main surfaces of the second tuning fork tine 12.

In more detail, each of the first and second main surfaces has a central linear portion, the grooves 13, 15 are formed in the central linear portions of the first and second main surfaces of the first tuning fork tine 11 and the grooves 14, 16 are similarly formed in the central linear portions of the first and second main surfaces of the second tuning fork tine 12. Each of the grooves 13, 14, 15, 16 has a width $W_2$, and the width $W_2$ including the central linear portion is preferable because a large moment occurs at the tuning fork tines 11, 12 and consequently, the tuning fork tines can vibrate in a flexural mode of an inverse phase easily. As a result of which, the piezoelectric crystal tuning fork resonator capable of vibrating in a fundamental mode can be obtained with a small series resistance $R_1$ and a high quality factor $Q_1$.

In addition, when each of the tuning fork tines 11, 12 has part widths $W_1$ and $W_3$, a tine width W of the tuning fork tines 11, 12 has a relationship of $W=W_1+W_2+W_3$, and the part widths $W_1$ and $W_3$ are constructed so that $W_1 \geq W_3$ or $W_1 < W_3$. In addition, the width $W_2$ is constructed so that $W_2 \geq W_1$, $W_3$. In this embodiment, also, the grooves are constructed at the tines so that a ratio $W_2/W$ of the width $W_2$ and the tine width W is greater than 0.35 and less than 1, preferably, within a range of 0.35 to 0.95 and a ratio $t_1/t$ is less than 0.79, where $t_1$ and t are a thickness of the groove and the tuning fork tines, respectively, to obtain a very large moment at the tuning fork tines. Consequently, the piezoelectric crystal tuning fork resonator, capable of vibrating in a flexural mode of an inverse phase, and having a frequency of high stability can be provided with a small series resistance $R_1$, a high quality factor $Q_1$ and a small capacitance ratio $r_1$ because it has a very large electromechanical transformation efficiency.

Likewise, each of the tuning fork tines 11, 12 has a length L and each of the grooves 13, 14, 15, 16 has a length $l_0$ (not shown here). In this embodiment, a ratio of the length $l_0$ and the length L is within a range of 0.3 to 0.8 to get a piezoelectric crystal tuning fork resonator with a small series resistance $R_1$ of a fundamental mode of vibration. In other words, the length $l_0$ is within a range of 30% to 80% to the length L. In general, the length $l_0$ is within a range of 0.45 mm to 1.25 mm.

In addition, electrodes 21, 22 are disposed on side surfaces of the tuning fork tine 11 and electrodes 17, 19 are disposed on surfaces (which comprise stepped portions and a base portion) of the grooves 13, 15 of the tuning fork tine 11. Similar to this, electrodes 23, 24 are disposed on side surfaces of the tuning fork tine 12 and electrodes 18, 20 are disposed on surfaces (which comprise stepped portions and a base portion) of the grooves 14, 16 of the tuning fork tine 12. In this embodiment, the electrodes 21, 22 are connected to the electrodes 23, 24 and the electrodes 22, 23 are connected to an electrode 26 disposed on the tuning fork base 25.

Likewise, the electrode 17 disposed on the surface of the groove 13 is connected to an electrode 17a disposed on the tuning fork base 25 and the electrode 19 disposed on the surface of the groove 15 is similarly connected to an electrode 19a disposed on the tuning fork base 25, and also, the electrode 17 is connected to the electrode 19 through an electrode 17b disposed on a side surface of the tuning fork base 25. As well, the electrode 18 disposed on the surface of the groove 14 is connected to an electrode 8a disposed on the tuning fork base 25 and the electrode 20 disposed on the surface of the groove 16 is similarly connected to an electrode 20a disposed on the tuning fork base 25, and also, the electrode 18 is connected to the electrode 20 through an electrode 18b disposed on a side surface of the tuning fork base 25.

Moreover, a distance between the tuning fork tines 11, 12 is defined by $W_4$ and the distance $W_4$ and the width $W_2$ of the groove are constructed so that $W_4 \geqq W_2$, and more, the distance $W_4$ is within a range of 0.045 mm to 0.65 mm and the width $W_2$ is within a range of 0.02 mm to 0.12 mm because it is easy to form a piezoelectric crystal tuning fork resonator having grooves formed in tuning fork tines thereof by a photo-lithographic process and an etching process, consequently, a frequency stability for a fundamental mode of vibration of the resonator gets higher than that for a second overtone mode of vibration thereof. In this embodiment, a piezoelectric crystal wafer having a thickness t of 0.045 mm to 0.35 mm is used.

In addition, to get a reduced series resistance $R_1$ of the piezoelectric crystal tuning fork resonator of this embodiment, it has a cutting angel of $ZYwt(\theta x)/(\theta z)$, and the $\theta x$ is in the range of $-20°$ to $+20°$ and the $\theta z$ is in the range of $-15°$ to $+15°$, where an expression of $ZYwt(\theta x)/(\theta z)$ accords to a notation of the IEEE. Also, x, y and z axes show an electrical axis, a mechanical axis and an optical axis of piezoelectric crystal and more, y' and z' axes show a respective new axis of the y and z axes rotated about the x axis with rotation angle $\theta x$. As an example, the piezoelectric crystal tuning fork resonator having the cutting angle of $ZYwt(\theta x)/(\theta z)$, according to the present invention, comprises a quartz crystal tuning fork resonator.

FIG. 2 shows an A-A' cross-sectional view of the tuning fork tines of the piezoelectric crystal tuning fork resonator in FIG. 1a. In this embodiment, the tuning fork tine 11 has grooves 13 and 15 cut into it, each of the grooves has a plurality of stepped portions and is formed in the central linear portion of each of the first and second main surfaces of the tuning fork tine 11, while the tuning fork tine 12 has grooves 14 and 16 cut into it, each of the grooves has a plurality of stepped portions and is formed in the central linear portion of each of the first and second main surfaces of the tuning fork tine 12. Namely, a groove having a plurality of stepped portions is formed in each of the first and second main surfaces of each of the tuning fork tines.

In addition, the electrodes 21, 22 are disposed on the side surfaces of the tuning fork tine 11 and the electrodes 23, 24 are disposed on the side surfaces of the tuning fork tine 12, and the electrodes 21, 22 are electrically connected to the electrodes 23, 24 to define a first electrode terminal B". In more detail, the electrodes 21, 22, 23 and 24 are a common electrode connected to an earth (or a ground) electrode.

Therefore, the first electrode terminal comprises an earth electrode that is grounded during use of the piezoelectric crystal resonator and has an earth electrical polarity. In other words, a zero voltage is applied to the first electrode terminal.

Likewise, the electrode 17 is disposed on each of two of the stepped portions of the groove 13 and the electrode 19 is disposed on each of two of the stepped portions of the groove 15, and the electrode 17 disposed on each of the two stepped portions of the groove 13 is connected to the electrode 19 disposed on each two of the stepped portions of the groove 15 to define a second electrode terminal B. In this embodiment, a plus voltage is applied to the second electrode terminal.

Similar to this, the electrode 18 is disposed on each of two of the stepped portions of the groove 14 and the electrode 20 is disposed on each of two of the stepped portions of the groove 16, and the electrode 18 disposed on each of the two stepped portions of the groove 14 is connected to the electrode 20 disposed on each of the two stepped portions of the groove 16 to define a third electrode terminal B'. In this embodiment, a minus voltage is applied to the third terminal. Namely, the second electrode terminal B has an electrical polarity opposite to an electrical polarity of the third electrode terminal B'. In more detail, in this embodiment a direct current (DC) voltage is applied between the electrode terminals B and B', but, an alternating current (AC) voltage is actually applied between the electrode terminals B and B' to drive the tuning fork tines.

Thus, the piezoelectric crystal tuning fork resonator comprises three electrode terminals and each of the three electrode terminals has a different electrical polarity.

Therefore, an electric field Ex is generated between each of the electrodes disposed on the side surfaces of each of the tuning fork tines and the electrode disposed on the stepped portion of the groove opposite to each of the electrodes disposed on the side surfaces. As a result of which, the piezoelectric crystal tuning fork resonator can be obtained with a small series resistance $R_1$ and a high quality factor Q because the electric field Ex operates linearly between the electrodes and an electromechanical transformation efficiency of the piezoelectric crystal tuning fork resonator gets large markedly.

Also, the piezoelectric crystal tuning fork resonator can vibrate in a flexural mode of an inverse phase by providing the three electrode terminal described above, and also, the flexural mode of the inverse phase comprises a fundamental mode of vibration and a second overtone mode of vibration.

In this embodiment, a sectional shape of each of the grooves 13, 14, 15 and 16 has a rectangular shape which has a constant width $W_2$ to a thickness direction, as illustrated in FIG. 2, but the sectional shape of each of the grooves comprises a U shape substantially in an actual shape, for example, when the piezoelectric crystal comprises quartz crystal and the piezoelectric crystal tuning fork resonator of the present invention is formed by a chemical etching method. In more detail, the sectional shape of the groove has the width $W_2$ of the groove which gets narrow gradually, according to decrease of a thickness $t_1$ of a base portion of the groove because quartz crystal is an anisotropic material and an etching speed by the chemical etching method is different in a direction of each of crystallographic axes of the quartz crystal.

Also, when $t_1$ represents a thickness of a base portion of the groove and t represents a thickness of each of the tuning fork tines, a ratio $t_1/t$ is preferably in the range of 0.01 to 0.79, and also, $t_1$ may be zero to define a through hole.

Figure 3A:
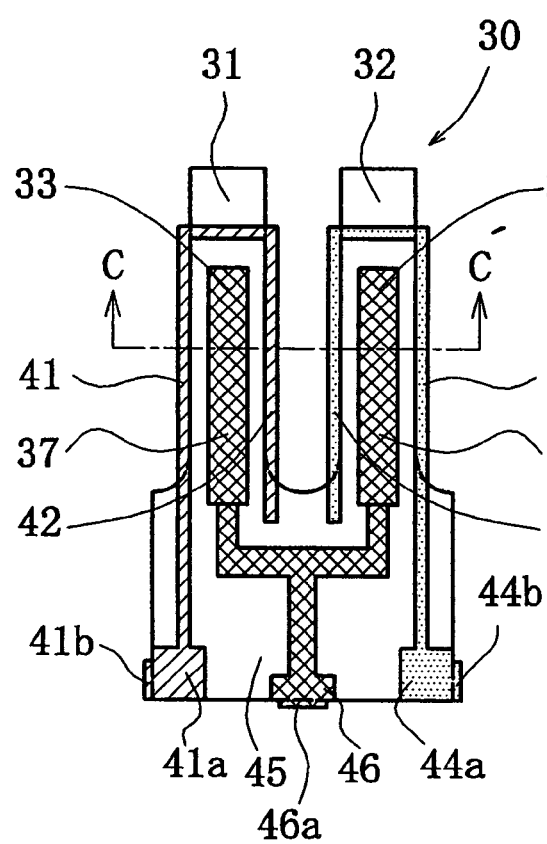
FIG. 3a and FIG. 3b show a top view and a bottom view of a piezoelectric crystal tuning fork resonator of a second embodiment of the present invention.
Figure 3B:
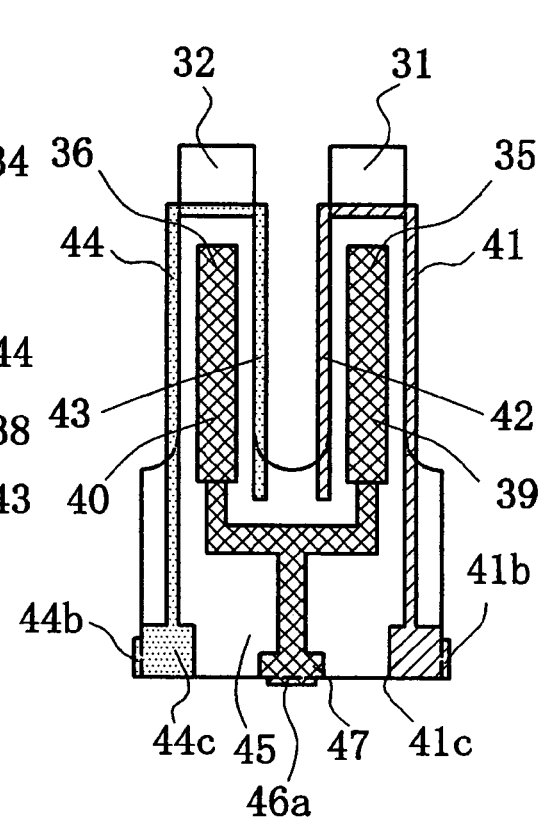

FIG. 3a and FIG. 3b show a top view and a bottom view of a piezoelectric crystal tuning fork resonator 30 of a second embodiment of the present invention. The piezoelectric crystal tuning fork resonator 30 comprises a tuning fork base 45 and a plurality of tuning fork tines 31, 32 connected to the tuning fork base 45, and the tuning fork tines comprise a first tuning fork tine 31 and a second tuning fork tine 32. In addition, each of the first and second tuning fork tines 31, 32 has opposite main surfaces and side surfaces, the opposite main surfaces have a first main surface and a second main surface opposite the first main surface and also, the side surfaces have a first side surface and a second side surface opposite the first side surface. In addition, grooves 33, 35 are formed in the first and second main surfaces of the first tuning fork tine 31 and grooves 34, 36 are formed in the first and second main surfaces of the second tuning fork tine 32.

In more detail, each of the first and second main surfaces has a central linear portion, the grooves 33, 35 are formed in the central linear portions of the first and second main surfaces of the first tuning fork tine 31 and the grooves 34, 36 are similarly formed in the central linear portions of the first and second main surfaces of the second tuning fork tine 32. Each of the grooves 33, 34, 35, 36 has a width $W_2$, and the width $W_2$ including the central linear portion is preferable because a large moment occurs at the tuning fork tines 31, 32 and consequently, the tuning fork tines can vibrate in a flexural mode of an inverse phase easily. As a result of which, the piezoelectric crystal tuning fork resonator capable of vibrating in a fundamental mode can be obtained with a small series resistance $R_1$ and a high quality factor $Q_1$.

In addition, electrodes 41, 42 are disposed on side surfaces of the tuning fork tine 31 and electrodes 37, 39 are disposed on surfaces of the grooves 33, 35 of the tuning fork tine 31. Similar to this, electrodes 43, 44 are disposed on side surfaces of the tuning fork tine 32 and electrodes 38, 40 are disposed on surfaces of the grooves 34, 36 of the tuning fork tine 32. In this embodiment, the electrode 41 is connected to the electrode 42 and also, the electrode 41 is connected to an electrode 41a and an electrode 41c disposed on the tuning fork tine 45 and the electrode 41a is connected to the electrode 41c through an electrode 41b disposed on a side surface of the tuning fork base 45. Similar to this, the electrode 43 is connected to the electrode 44 and also, the electrode 44 is connected to an electrode 44a and an electrode 44c disposed on the tuning fork tine 45 and the electrode 44a is connected to the electrode 44c through an electrode 44b disposed on a side surface of the tuning fork base 45.

Also, the electrode 37 disposed on the surface of the groove 33 is connected to the electrode 38 disposed on the surface of the groove 34 and the electrodes 37, 38 are connected to an electrode 46 disposed on the tuning fork base 45, while the electrode 39 disposed on the surface of the groove 35 is connected to the electrode 40 disposed on the surface of the groove 36 and more, the electrodes 39, 40 are connected to an electrode 47 disposed on the tuning fork base 45. In addition, the electrode 46 is connected to the electrode 47 through an electrode 46a disposed on an end surface of the tuning fork base 45. Namely, the electrodes 37, 38 are electrically connected to the electrodes 39, 40.

Figure 4:
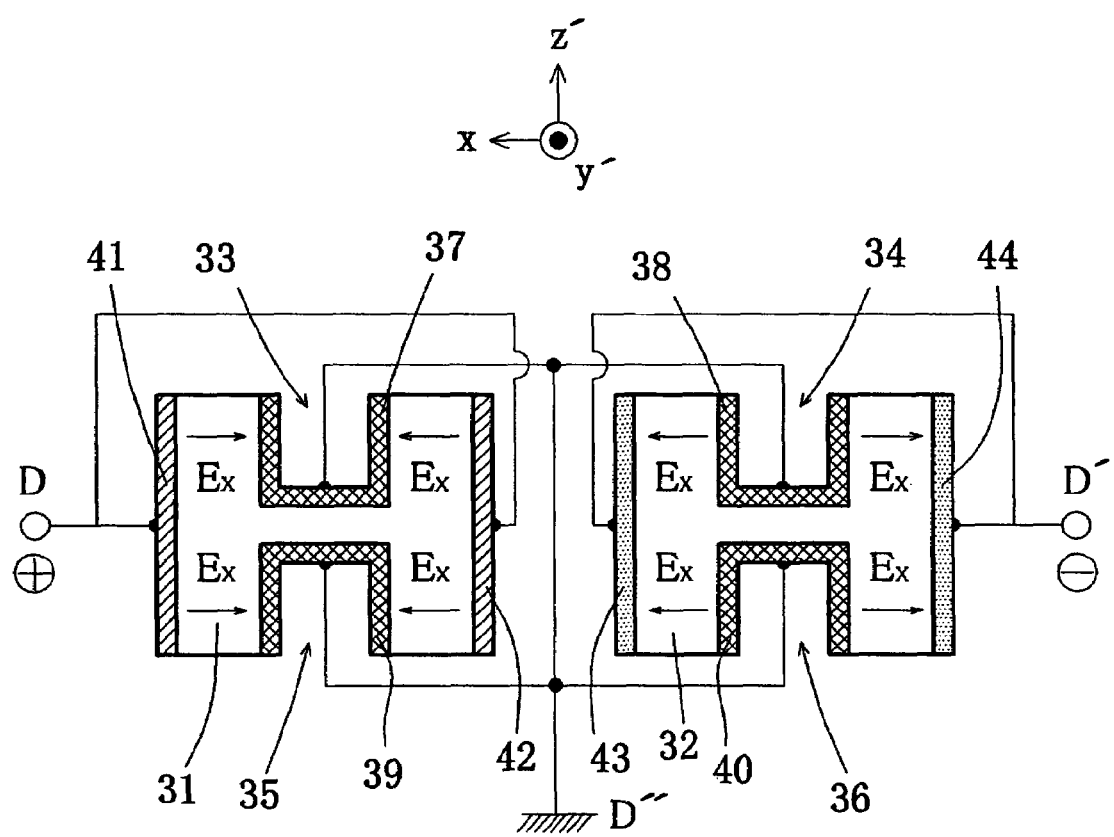

FIG. 4 shows a C-C' cross-sectional view of the tuning fork tines 31 and 32 of the piezoelectric crystal tuning fork resonator 30 in FIG. 3a. In this embodiment, the tuning fork tine 31 has grooves 33 and 35 cut into it, each of the grooves has a plurality of stepped portions and is formed in the central linear portion of each of the first and second main surfaces of the tuning fork tine 31, while the tuning fork tine 32 has grooves 34 and 36 cut into it, each of the grooves has a plurality of stepped portions and is formed in the central linear portion of each of the first and second main surfaces of the tuning fork tine 32. Namely, a groove having a plurality of stepped portions is formed in each of the first and second main surfaces of each of the tuning fork tines.

In addition, the electrode 37 is disposed on each of two of the stepped portions of the groove 33 and the electrode 39 is disposed on each of two of the stepped portions of the groove 35, and the electrode 37 disposed on each two of the stepped portions of the groove 33 is connected to the electrode 39 disposed on each of the two stepped of the groove 35. Similar to this, the electrode 38 is disposed on each of two of the stepped portions of the groove 34 and the electrode 40 is disposed on each of two of the stepped portions of the groove 36, and the electrode 38 disposed on each of the two stepped portions of the groove 34 is connected to the electrode 40 disposed on each of the two stepped portions of the groove 36. Namely, the electrodes 37, 39 are connected to the electrodes 38, 40 to define a first electrode terminal D". In more detail, the electrodes 37, 38, 39 and 40 are a common electrode connected to an earth (or a ground) electrode. Therefore, the first electrode terminal comprises an earth electrode having an earth electrical polarity. In other words, a zero voltage is applied to the first electrode terminal.

Likewise, the electrodes 41, 42 are disposed on the side surfaces of the tuning fork tine 31 and the electrode 41 is electrically connected to the electrode 42 to define a second electrode terminal D. In this embodiment, a plus voltage is applied to the second electrode terminal.

Similar to this, the electrodes 43, 44 are disposed on the side surfaces of the tuning fork tine 32 and the electrode 43 is electrically connected to the electrode 44 to define a third electrode terminal D'. In this embodiment, a minus voltage is applied to the third terminal. Namely, the second electrode terminal D has an electrical polarity opposite to an electrical polarity of the third electrode terminal D'. Similar to the previous embodiment, a direct current (DC) voltage is applied between the electrode terminals D and D', but, an alternating current (AC) voltage is actually applied between the electrode terminals D and D' to drive the tuning fork tines.

Thus, the piezoelectric crystal tuning fork resonator comprises three electrode terminals and each of the three electrode terminals has a different electrical polarity.

In this embodiment, an electric field Ex is generated between each of the electrodes disposed on the side surfaces of each of the tuning fork tines and the electrode disposed on the stepped portion of the groove opposite to each of the electrodes disposed on the side surfaces. As a result of which, the piezoelectric crystal tuning fork resonator can be obtained with a small series resistance $R_1$ and a high quality factor Q because the electric field Ex operates linearly between the electrodes and an electromechanical transformation efficiency of the piezoelectric crystal tuning fork resonator gets large markedly.

Also, the piezoelectric crystal tuning fork resonator can vibrate in a flexural mode of an inverse phase by providing the three electrode terminal described above, and also, the flexural mode of the inverse phase comprises a fundamental mode of vibration and a second overtone mode of vibration.

Figure 5:
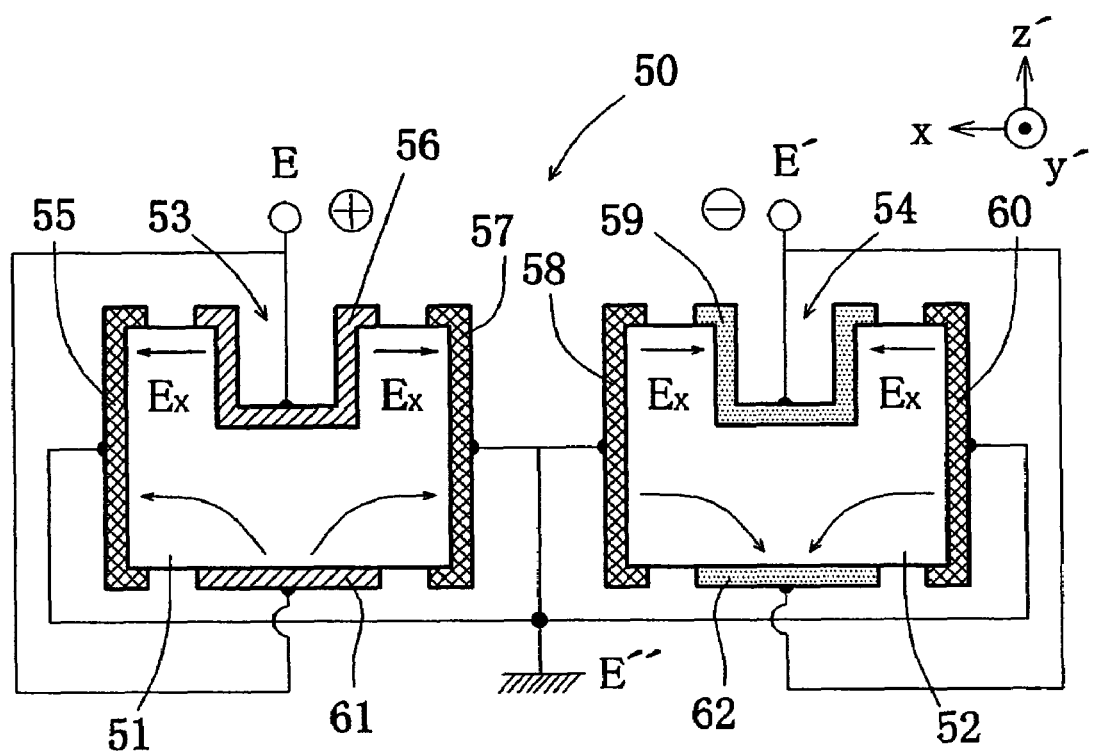
FIG. 5 shows a cross-sectional view of tuning fork tines of a piezoelectric crystal tuning fork resonator of a third embodiment of the present invention.

FIG. 5 shows a cross-sectional view of tuning fork tines 51, 52 of a piezoelectric crystal tuning fork resonator 50 of a third embodiment of the present invention. The tuning fork tines 51, 52 of the piezoelectric crystal tuning fork resonator 50 are connected to a tuning fork base. Also, each of the tuning fork tines has opposite main surfaces and side surfaces, the opposite main surfaces have a first main surface and a second main surface opposite the first main surface and the side surfaces have a first side surface and a second side surface opposite the first side surface.

In this embodiment, the tuning fork tine 51 has a groove 53 cut into it, the groove 53 has a plurality of stepped portions and is formed in a central linear portion of the first main surface of the tuning fork tine 51, while the tuning fork tine 52 has a groove 54 cut into it, the groove has a plurality of stepped portions and is formed in a central linear portion of the first main surface of the tuning fork tine 52. Namely, a groove having a plurality of stepped portions is formed in each of the first main surfaces of each of the tuning fork tines.

In addition, electrodes 55, 57 are disposed on the side surfaces of the tuning fork tine 51 and electrodes 58, 60 are disposed on the side surfaces of the tuning fork tine 52, and the electrodes 55, 57 are electrically connected to the electrodes 58, 60 to define a first electrode terminal E". In more detail, the electrodes 55, 57, 58 and 60 are a common electrode connected to an earth (or a ground) electrode. Therefore, the first electrode terminal comprises an earth electrode having an earth electrical polarity. In other words, a zero voltage is applied to the first electrode terminal.

Likewise, an electrode 56 is disposed on each of two of the stepped portions of the groove 53 and an electrode 61 is disposed on the second main surface of the tuning fork tine 51, and the electrode 56 disposed on each of the two stepped portions of the groove 53 is connected to the electrode 61 disposed on the second main surface of the tuning fork tine 51 to define a second electrode terminal E. In this embodiment, a plus voltage is applied to the second electrode terminal.

Similar to this, an electrode 59 is disposed on each of two of the stepped portions of the groove 54 and an electrode 62 is disposed on the second main surface of the tuning fork tine 52, and the electrode 59 disposed on each of the two stepped portions of the groove 54 is connected to the electrode 62 disposed on the second main surface of the tuning fork tine 52 to define a third electrode terminal E'. In this embodiment, a minus voltage is applied to the third terminal. Namely, the second electrode terminal E has an electrical polarity opposite to an electrical polarity of the third electrode terminal E'. In more detail, in this embodiment a direct current (DC) voltage is applied between the electrode terminals E and E', but, an alternating current (AC) voltage is actually applied between the electrode terminals E and E' to drive the tuning fork tines.

Thus, the piezoelectric crystal tuning fork resonator comprises three electrode terminals and each of the three electrode terminals has a different electrical polarity. In this embodiment, a groove having a plurality of stepped portions is formed on each of the first main surfaces of each of the tuning fork tines, but the present invention is not limited to this, as an example, a groove having a plurality of stepped portions may be formed in either the first main surface or the second main surface of each of the tuning fork tines. As another example, no groove may be formed in each of the first and second main surfaces of each of the tuning fork tines.

Figure 6:
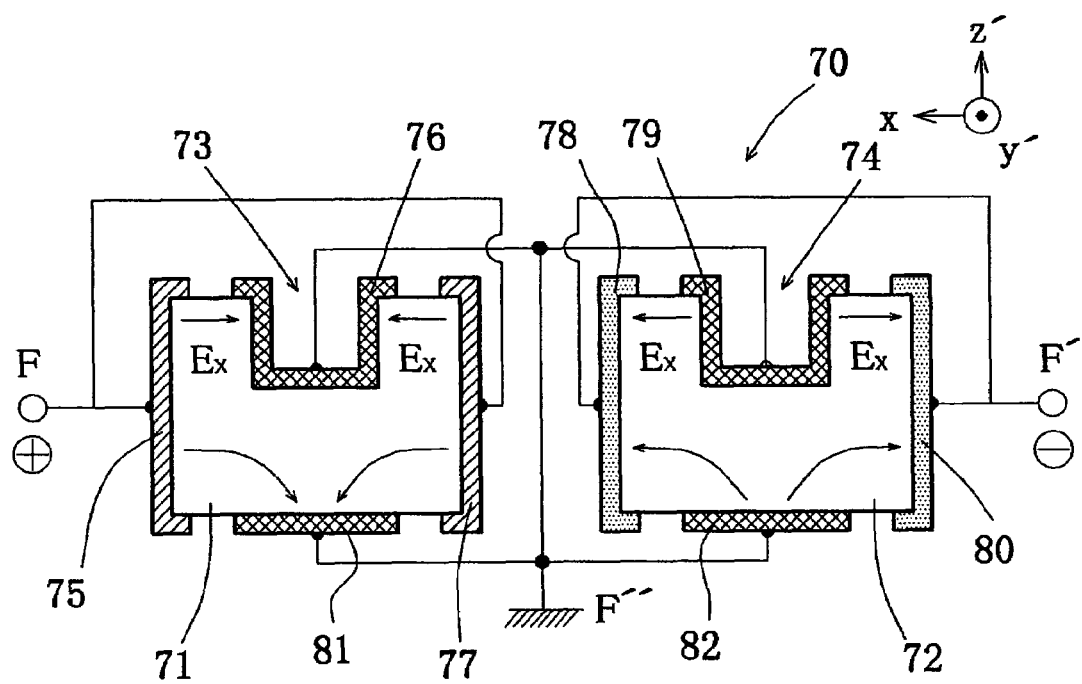
FIG. 6 shows a cross-sectional view of tuning fork tines of a piezoelectric crystal tuning fork resonator of a fourth embodiment of the present invention.

FIG. 6 shows a cross-sectional view of tuning fork tines 71, 72 of a piezoelectric crystal tuning fork resonator 70 of a fourth embodiment of the present invention. The tuning fork tines 71, 72 of the piezoelectric crystal tuning fork resonator 70 are connected to a tuning fork base. Also, each of the tuning fork tines has opposite main surfaces and side surfaces, the opposite main surfaces have a first main surface and a second main surface opposite the first main surface and the side surfaces have a first side surface and a second side surface opposite the first side surface.

In this embodiment, the tuning fork tine 71 has a groove 73 cut into it, the groove 73 has a plurality of stepped portions and is formed in a central linear portion of the first main surface of the tuning fork tine 71, while the tuning fork tine 72 has a grooves 74 cut into it, the groove has a plurality of stepped portions and is formed in a central linear portion of the first main surface of the tuning fork tine 72. Namely, a groove having a plurality of stepped portions is formed in each of the first main surfaces of each of the tuning fork tines.

In addition, an electrode 76 is disposed on each of two of the stepped portions of the groove 73 and an electrode 81 is disposed on the second main surface of the tuning fork tine 71, and the electrode 76 disposed on each of the two stepped portions of the groove 73 is connected to the electrode 81 disposed on the second main surface of the tuning fork tine 71. Similar to this, an electrode 79 is disposed on each of two of the stepped portions of the groove 74 and an electrode 82 is disposed on the second main surface of the tuning fork tine 72, and the electrode 79 disposed on each of the two stepped portions of the groove 74 is connected to the second main surface of the tuning fork tine 72. Namely, the electrodes 76, 81 are connected to the electrodes 79, 82 to define a first electrode terminal F". In more detail, the electrodes 76, 79, 81 and 82 are a common electrode connected to an earth (or a ground) electrode. Therefore, the first electrode terminal comprises an earth electrode having an earth electrical polarity. In other words, a zero voltage is applied to the first electrode terminal.

Likewise, electrodes 75, 77 are disposed on the side surfaces of the tuning fork tine 71 and the electrode 75 is electrically connected to the electrode 77 to define a second electrode terminal F. In this embodiment, a plus voltage is applied to the second electrode terminal.

Similar to this, electrodes 78, 80 are disposed on the side surfaces of the tuning fork tine 72 and the electrode 78 is electrically connected to the electrode 80 to define a third electrode terminal F'. In this embodiment, a minus voltage is applied to the third terminal. Namely, the second electrode terminal F has an electrical polarity opposite to an electrical polarity of the third electrode terminal F'.

Thus, the piezoelectric crystal tuning fork resonator comprises three electrode terminals and each of the three electrode terminals has a different electrical polarity.

As shown in FIG. 5 and FIG. 6, an electric field Ex is generated between the electrode disposed on the side surface of each of the tuning fork tines and the electrode disposed on the stepped portion of the groove opposite to the electrode disposed on the side surface. As a result of which, the piezoelectric crystal tuning fork resonator can be obtained with a small series resistance $R_1$ and a high quality factor Q because the electric field Ex operates linearly between the electrodes and an electromechanical transformation efficiency of the piezoelectric crystal tuning fork resonator gets large markedly.

Figure 7:
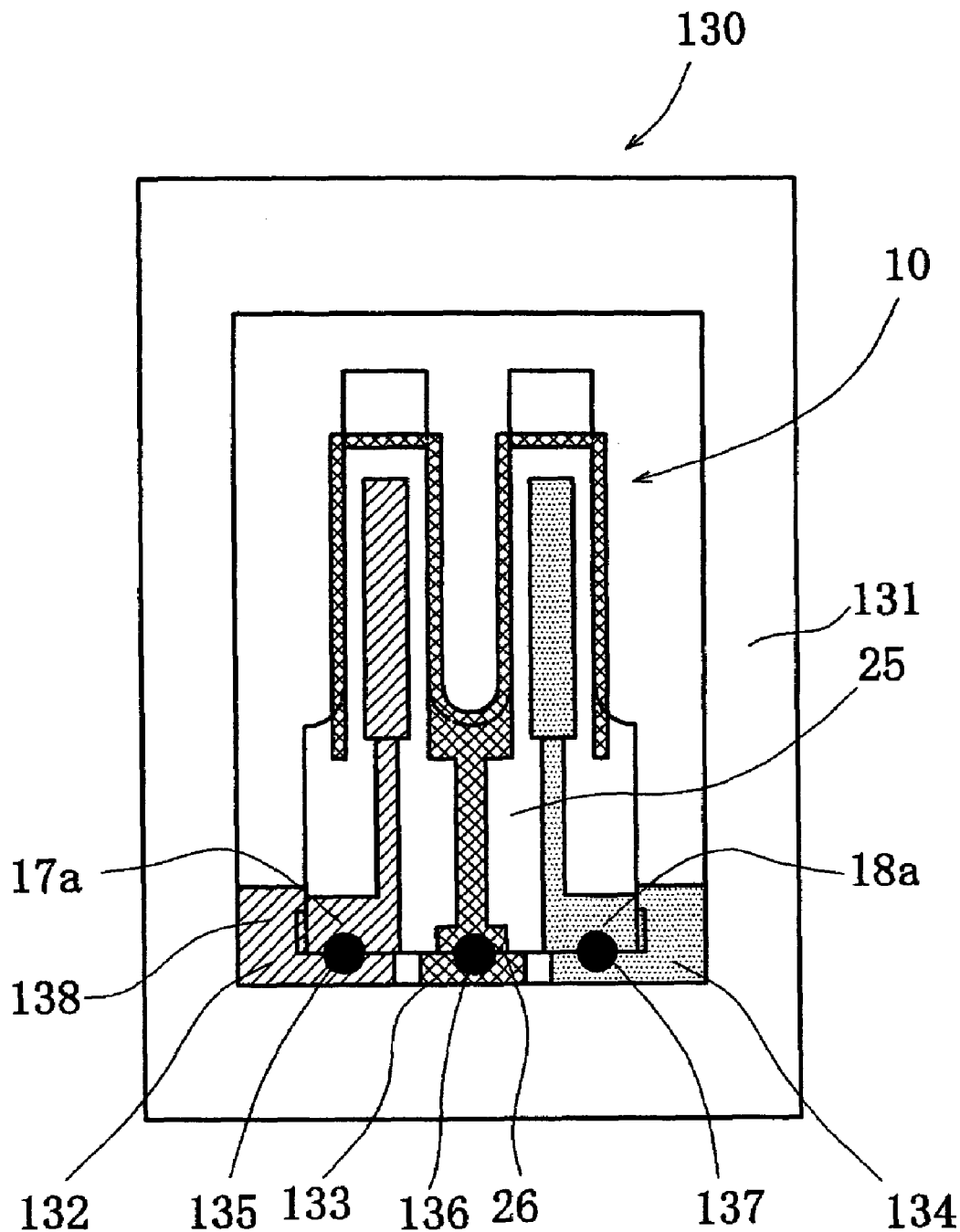
FIG. 7 shows a plan view of a piezoelectric crystal unit comprising a piezoelectric crystal tuning fork resonator embodying the present invention and omitting a lid.

In addition, a piezoelectric crystal tuning fork resonator is housed in a piezoelectric crystal unit in vacuum to get a reduced series resistance. FIG. 7 shows a plan view of a piezoelectric crystal unit comprising a piezoelectric crystal tuning fork resonator embodying the present invention and omitting a lid. In this embodiment, the piezoelectric crystal unit 130 comprises the piezoelectric crystal tuning fork resonator 10 shown in FIG. 1a and FIG. 1b, a case 131 for housing the piezoelectric crystal resonator and a lid for covering an open end of the case (not shown here). The piezoelectric crystal tuning fork resonator 10 comprises the tuning fork base 25 having the electrodes 17a, 26 and 18a. Also, the case 131 comprises a mounting portion 138 on which electrodes 132, 133 and 134 are disposed. In addition, the electrode 17a is connected to the electrode 132 through a conductive material 135 such as conductive adhesives and a metal, the electrode 26 is also connected to the electrode 133 through a conductive material 136, and more, the electrode 18a is connected to the electrode 134 through a conductive material 137.

In this embodiment, the piezoelectric crystal unit comprises the piezoelectric crystal tuning fork resonator 10 shown in FIG. 1a and FIG. 1b, but, instead of the piezoelectric crystal tuning fork resonator 10, the piezoelectric crystal unit may comprise at least one of the piezoelectric crystal tuning fork resonators shown in FIG. 3a and FIG. 3b and FIG. 5 and FIG. 6.

Figure 7A:
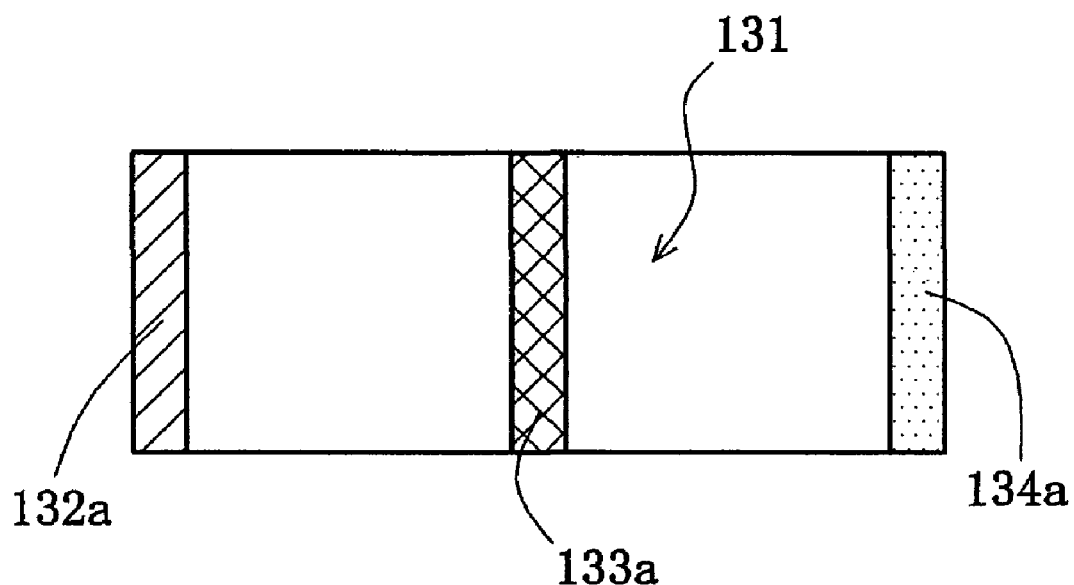
FIG. 7a shows an example of a bottom view of the case in FIG. 7.

FIG. 7a shows an example of a bottom view of the case in FIG. 7. The bottom of the case 131 comprises three electrodes 132a, 133a and 134a. Each of the electrodes 132a, 133a and 134a is electrically connected to the electrode 132, the electrode 133 and the electrode 134, respectively. In this embodiment, the electrode 132a has an electrical polarity opposite to an electrical polarity of the electrode 134a and the electrode 133a which is an earth electrode is located between the electrodes 132a and 134a.

Figure 7B:
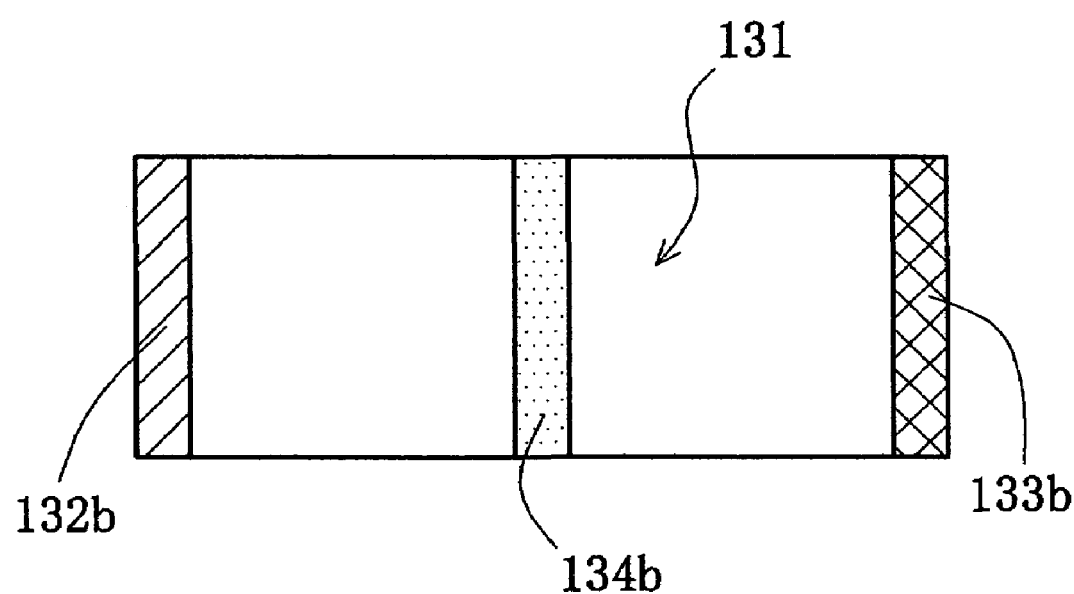
FIG. 7b shows another example of a bottom view of the case in FIG. 7.

FIG. 7b shows another example of a bottom view of the case in FIG. 7. The bottom of the case 131 comprises three electrodes 132b, 133b and 134b. Each of the electrodes 132b, 133b and 134b is electrically connected to the electrode 132, the electrode 133 and the electrode 134, respectively. In this embodiment, the electrode 132b has an electrical polarity opposite to an electrical polarity of the electrode 134b and also, the electrode 134b is located between the electrode 132b and the electrode 133b which is an earth electrode.

As illustrated in FIGS. 7a and 7b, the bottom of the case has the three electrodes, each of which has a different electrical polarity. A disposition of the electrodes of the present invention is not limited to that of FIGS. 7a and 7b, but, the present invention also includes any electrode disposition in which three electrodes each of which has a different electrical polarity, are disposed on a bottom surface of a case for housing a piezoelectric crystal tuning fork resonator.

Figure 8:
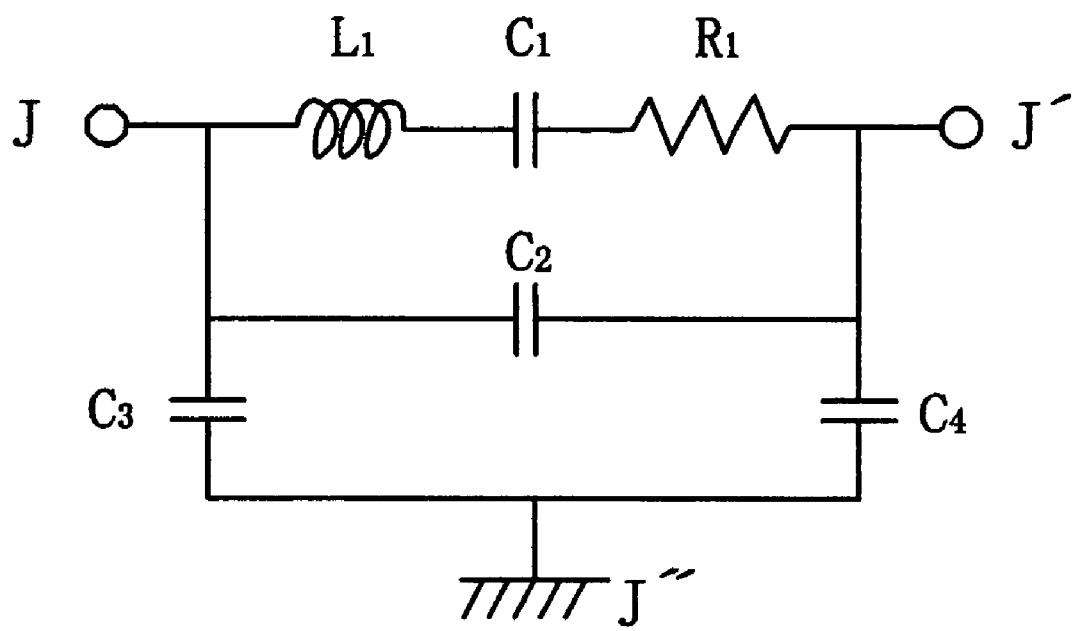
FIG. 8 shows a diagram of an electrical equivalent circuit of a piezoelectric crystal tuning fork resonator of the present invention, and having three electrode terminals.
Figure 9:
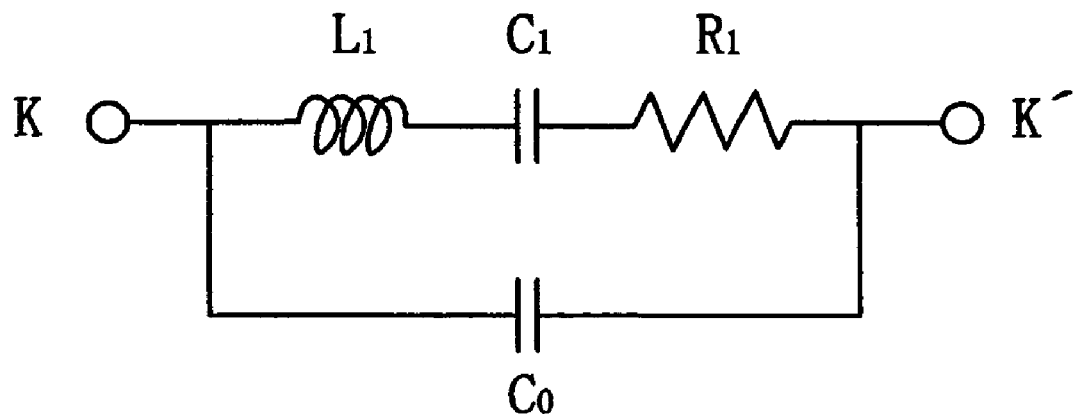
FIG. 9 shows a diagram of another electrical equivalent circuit of the piezoelectric crystal tuning fork resonator in FIG. 8, and having two electrode terminals.

FIG. 8 shows a diagram of an electrical equivalent circuit of a piezoelectric crystal tuning fork resonator of the present invention. In FIG. 8, the equivalent circuit comprises three electrode terminals J, J' and J" and also, comprises a series resonance arm and capacitances between electrode terminals. In more detail, the series resonance arm comprises motional inductance $L_1$, motional capacitance $C_1$ and a series resistance $R_1$. In addition, the capacitance $C_2$ is between the electrode terminals J and J', the capacitance $C_3$ is between the electrode terminals J and J" and the capacitance $C_4$ is between the electrode terminals J' and J". Therefore, the sum of these capacitances can be electrically replaced with shunt capacitance $C_0$ between two electrode terminals K and K' shown in FIG. 9. Namely, there is a relationship of $C_0=C_2+C_3+C_4$ and the three electrode terminals can be substantially treated with the two electrode terminals.

Figure 10:
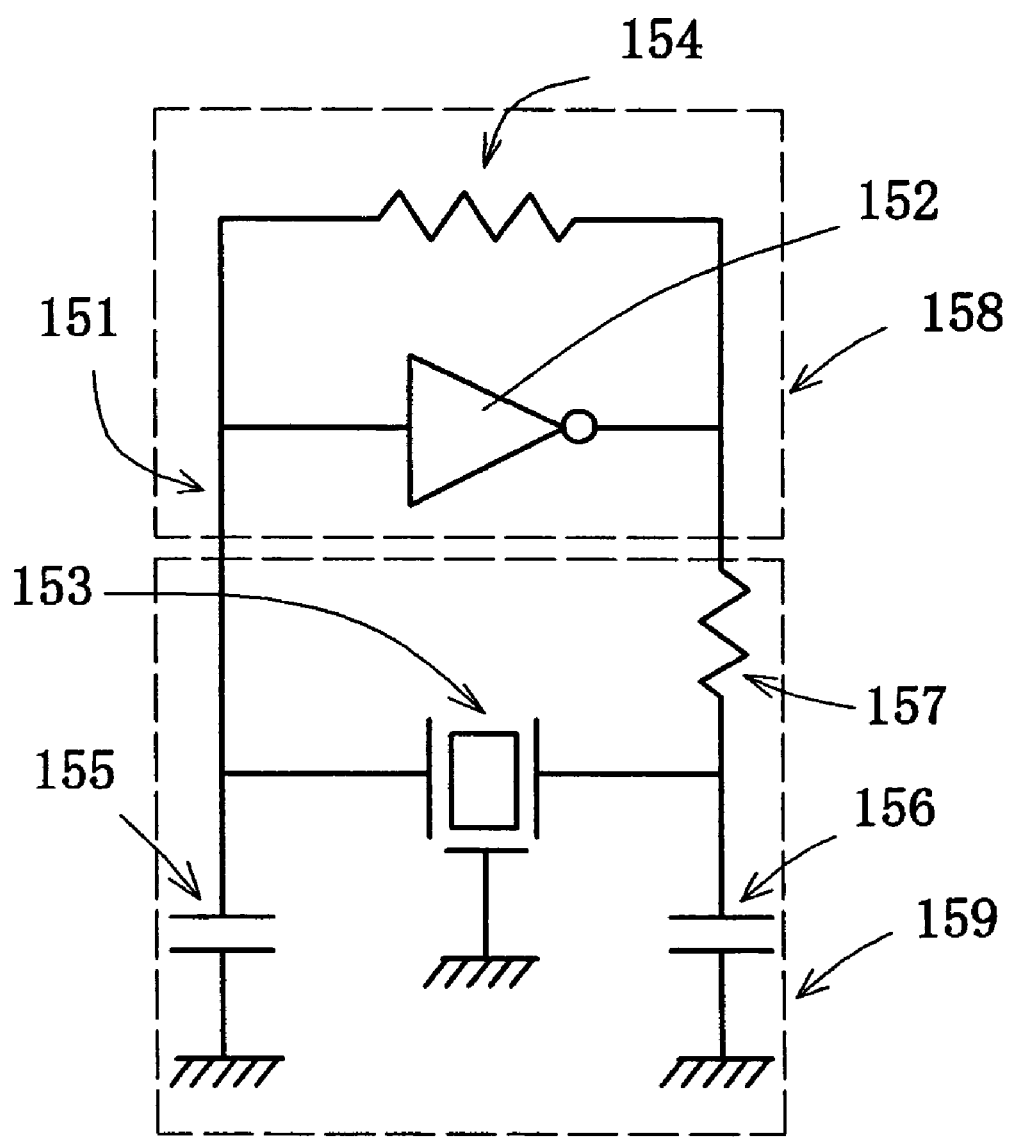
FIG. 10 shows a diagram of an embodiment of a crystal oscillating circuit comprising an amplification circuit having an amplifier and a feedback circuit having a piezoelectric crystal tuning fork resonator of the present invention, and which constructs a crystal oscillator.

In addition, a piezoelectric crystal tuning fork resonator is actually used to get a crystal oscillator. FIG. 10 shows a diagram of an embodiment of a crystal oscillating circuit which constructs a crystal oscillator having a piezoelectric crystal tuning fork resonator of the present invention. The crystal oscillating circuit 151 comprises an amplifier (CMOS inverter) 152, a feedback resistor 154, a drain resistor 157, a plurality of capacitors 155, 156 and a piezoelectric crystal tuning fork resonator 153.

Namely, the oscillating circuit 151 comprises an amplification circuit 158 having the amplifier 152 and the feedback resistor 154, and a feedback circuit 159 having the drain resistor 157, the capacitors 155, 156 and the piezoelectric crystal tuning fork resonator 153. The piezoelectric crystal tuning fork resonator 153 is one of the piezoelectric crystal tuning fork resonators already described above. For example, when the piezoelectric crystal tuning fork resonator vibrates in a flexural mode of an inverse phase, an output signal of the oscillating circuit 151 is outputted through a buffer circuit (not shown in FIG. 10), and is an oscillating frequency of a fundamental mode of vibration of the piezoelectric crystal tuning fork resonator.

In other words, the oscillation frequency of the fundamental mode of vibration of the piezoelectric crystal tuning fork resonator is outputted from the oscillating circuit through the buffer circuit as an output signal. According to the present invention, a nominal frequency of the fundamental mode of vibration of the piezoelectric crystal tuning fork resonator is within a range of 10 kHz to 200 kHz. Especially, an oscillation frequency of about 32.768 kHz is very available for use in an electronic apparatus. In general, the output signal has an oscillation frequency which is within a range of −100 PPM to +100 PPM to the nominal frequency, e.g. 32.768 kHz. In addition, as another example, when m has an even number, the nominal frequency of the present invention has a frequency of 32.768×m kHz, while when m has an odd number including m=1, the nominal frequency of the present invention has a frequency of 16.384×m kHz.

In more detail, the crystal oscillator in this example comprises a crystal oscillating circuit and a buffer circuit, namely, the crystal oscillating circuit comprises an amplification circuit and a feedback circuit, and the amplification circuit comprises an amplifier (CMOS inverter) and a feedback resistor and the feedback circuit comprises a piezoelectric crystal tuning fork resonator capable of vibrating in a flexural mode of an inverse phase, a drain resistor and a plurality of capacitors.

Figure 11:
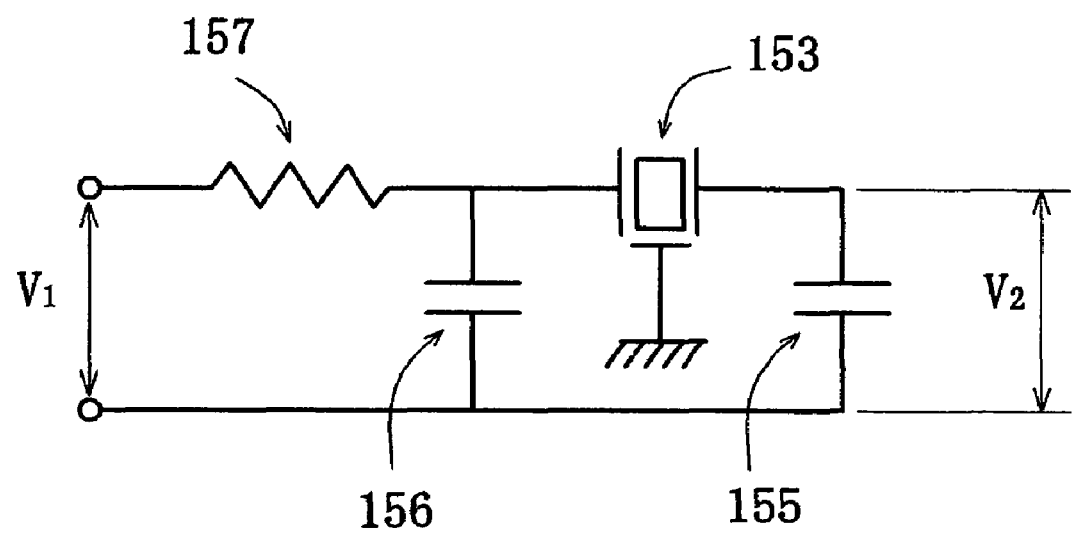
FIG. 11 shows a diagram of the feedback circuit of FIG. 10.

FIG. 11 shows a diagram of the feedback circuit of FIG. 10. In this embodiment, the feedback circuit has the piezoelectric crystal tuning fork resonator having a fundamental mode of vibration and a second overtone mode of vibration. Now, when angular frequency $\omega_i$ of the piezoelectric crystal tuning fork resonator 153, a resistance value $R_d$ of the drain resistor 157, capacitance values $C_g$, $C_d$ of the capacitors 155, 156, crystal impedance $R_{ei}$ of the crystal resonator 153, an input voltage $V_1$ and an output voltage $V_2$ are taken, a feedback rate $\beta_i$ is defined by $\beta_i=|V_2|_i/|V_1|_i$, where i shows a vibration order of the crystal tuning fork resonator, for example, when i=1 and 2, $\beta_1$ and $\beta_2$ are a feedback rate for a fundamental mode of vibration and a second overtone mode of vibration of the crystal tuning fork resonator, respectively.

In addition, load capacitance $C_L$ is defined by $C_L=C_gC_d/(C_g+C_d)$, and when $C_g=C_d=C_{gd}$ and $R_d\gg R_{ei}$, the feedback rate $\beta_i$ has a relationship of $\beta_i=1/(1+kC_L^2)$, where k is expressed by a function of $\omega_i$, $R_d$ and $R_{ei}$. Also, $R_{ei}$ is approximately equal to series resistance $R_i$ of the piezoelectric crystal tuning fork resonator.

Thus, it is easily understood from a relationship of the feedback rate $\beta_i$ and load capacitance $C_L$ that the feedback rate of the fundamental mode of vibration and the second overtone mode of vibration becomes large, respectively, according to decrease of load capacitance $C_L$. Therefore, when $C_L$ has a small value, an oscillation of the second overtone mode of vibration occurs very easily, instead of that of the fundamental mode of vibration because maximum amplitude of the second overtone mode of vibration becomes smaller than that of the fundamental mode of vibration, and the oscillation of the second overtone mode of vibration satisfies an amplitude condition and a phase condition simultaneously which are the continuous condition of the oscillation in the oscillating circuit.

As it is also an object of the present invention to provide a crystal oscillator having a flexural mode, piezoelectric crystal tuning fork resonator capable of vibrating in a fundamental mode and having reduced electric current consumption, load capacitance $C_L$ is less than 25 pF in this embodiment to reduce electric current consumption. To get much reduced electric current consumption, $C_L$ is preferably less than 15 pF because the electric current consumption is proportional to $C_L$.

In addition, in order to suppress a second overtone mode of vibration of the piezoelectric crystal tuning fork resonator and to obtain a crystal oscillator having an output signal of an oscillation frequency of a fundamental mode of vibration of the piezoelectric crystal tuning fork resonator, the crystal oscillator comprising an amplification circuit and a feedback circuit is constructed so that it satisfies a relationship of $\alpha_1/\alpha_2 > \beta_2/\beta_1$ and $\alpha_1\beta_1 > 1$, where $\alpha_1$ and $\alpha_2$ are, respectively, an amplification rate of the fundamental mode of vibration and the second overtone mode of vibration of the amplification circuit, and $\beta_1$ and $\beta_2$ are, respectively, a feedback rate of the fundamental mode of vibration and the second overtone mode of vibration of the feedback circuit.

In other words, the crystal oscillator is constructed so that a ratio of the amplification rate $\alpha_1$ of the fundamental mode of vibration and the amplification rate $\alpha_2$ of the second overtone mode of vibration of the amplification circuit is greater than that of the feedback rate $\beta_2$ of the second overtone mode of vibration and the feedback rate $\beta_1$ of the fundamental mode of vibration of the feedback circuit and also a product of the amplification rate $\alpha_1$ and the feedback rate $\beta_1$ of the fundamental mode of vibration is greater than 1.

Also, characteristics of the amplifier of the amplification circuit which constructs the crystal oscillating circuit of this embodiment can be expressed by negative resistance $-RL_1$. For example, when i=1, negative resistance $-RL_1$ is for a fundamental mode of vibration of the piezoelectric crystal tuning fork resonator and when i=2, negative resistance $-RL_2$ is for a second overtone mode of vibration of the piezoelectric crystal tuning fork resonator. In this embodiment, the crystal oscillating circuit is constructed so that a ratio of an absolute value of negative resistance $-RL_1$ of the fundamental mode of vibration of the amplification circuit and series resistance $R_1$ of the fundamental mode of vibration is greater than that of an absolute value of negative resistance $-RL_2$ of the second overtone mode of vibration of the amplification circuit and series resistance $R_2$ of the second overtone mode of vibration.

That is, the oscillating circuit is constructed so that it satisfies a relationship of $|-RL_1|/R_1 > |-RL_2|/R_2$. By constructing the oscillating circuit like this, an oscillation of the second overtone mode of vibration can be suppressed, as a result of which a frequency of oscillation of the fundamental mode of vibration can be output as an output signal because the oscillation of the fundamental mode generates easily in the oscillating circuit. In more detail, an absolute value of the negative resistance $-RL_1$ is greater than 105 k$\Omega$, preferably, within a range of 105 k$\Omega$ to 650 k$\Omega$, and an absolute value of the negative resistance $-RL_2$ is less than 105 k$\Omega$ to suppress the frequency of oscillation of the second overtone mode of the piezoelectric crystal tuning fork resonator in the oscillating circuit and to obtain the frequency of oscillation of the fundamental mode thereof.

Figure 12:
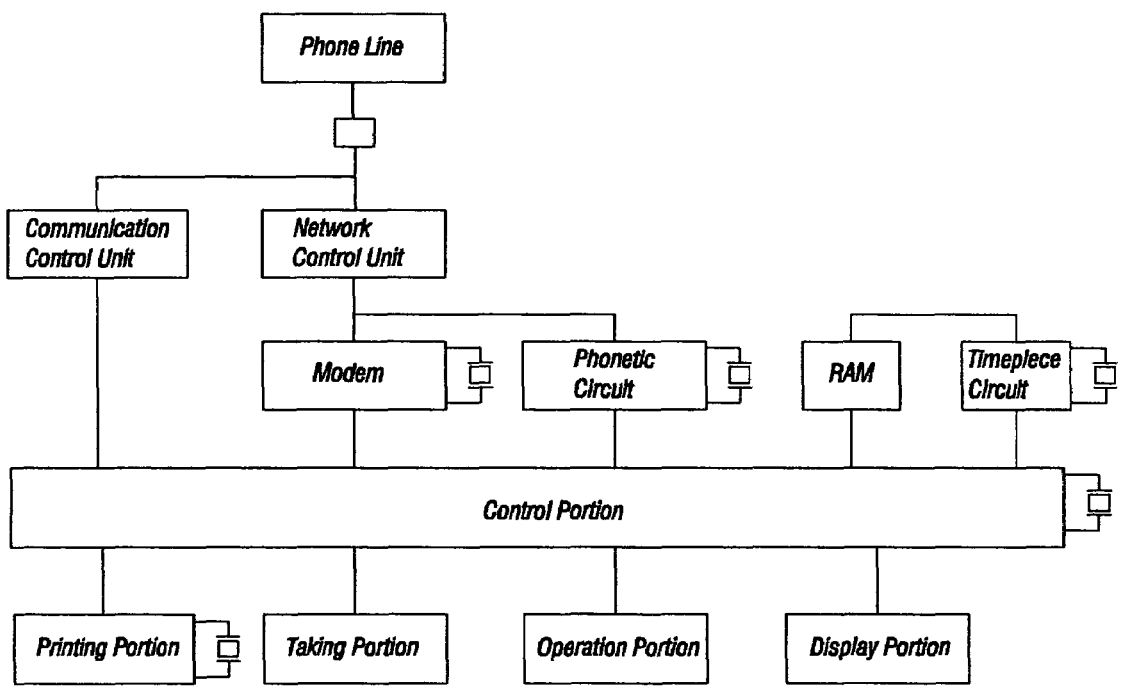
FIG. 12 shows a block diagram of an embodiment of an electronic apparatus comprising a piezoelectric crystal tuning fork resonator of the present invention.

FIG. 12 shows a block diagram of an embodiment of an electronic apparatus of the present invention and the block diagram of a facsimile apparatus is shown in this embodiment. As shown in FIG. 12, the apparatus generally comprises a modem, a phonetic circuit, a timepiece circuit, a printing portion, a taking portion, an operation portion and a display portion. In this principle, perception and scanning of reflection light of light projected on manuscript in the taking portion are performed by CCD (Charge Coupled Device), in addition, light and shade of the reflection light are transformed into a digital signal, and the signal is modulated by the modem and is sent to a phone line (communication line). Also, in a receiving side, a received signal is demodulated by the modem and is printed oh a paper in the print portion by synchronizing the received signal with a signal of a sending side.

In FIG. 12, a piezoelectric crystal resonator is used as a CPU clock of the control portion and the printing portion, as a clock of the phonetic circuit and the modem, and as a time standard of the timepiece. Namely, the piezoelectric crystal resonator constructs a crystal oscillator having an amplifier, capacitors and resistors, and an output signal of the oscillator is used for use in operation of the electronic apparatus. In this embodiment, a plurality of oscillators is used for the facsimile apparatus. For example, an output signal of one of the oscillators is used to display time, date, calendar and so forth at the display portion of the facsimile apparatus. In other words, the output signal of the oscillator is used to display something at the display portion.

In order to get the output signal of the oscillator which is used to display time, date, calendar and so forth at the display portion of the facsimile apparatus, it is very available to utilize the piezoelectric crystal tuning fork resonator of the present invention in the oscillator because it has a zero temperature coefficient in the vicinity of a room temperature, a small series resistance and a high quality factor.

In more detail, the piezoelectric crystal tuning fork resonator of the present invention vibrates in a flexural mode of an inverse phase and is made of quartz crystal because the quartz crystal is a very stable material physically and chemically and also, the quartz crystal tuning fork resonator has a zero temperature coefficient in the vicinity of a room temperature, a small series resistance and a high quality factor. Like this, it can be easily understood that the piezoelectric crystal tuning fork resonator of the present invention is very available for use in operation of each of electronic apparatus of the present invention.

In addition, e.g. as the CPU clock of the facsimile apparatus, a piezoelectric crystal resonator capable of vibrating in a contour mode such as a length-extensional mode, a width-extensional mode and a Lame mode or a piezoelectric crystal resonator capable of vibrating in a thickness shear mode is used. In general, the piezoelectric crystal resonators are made of quartz crystal, lithium tantalite, lithium niobate and so on. In order to get the facsimile apparatus which operates normally, an accuracy signal of output of the oscillator is required for the facsimile apparatus, and the aim can be achieved by utilizing the piezoelectric crystal resonator capable of vibrating in the contour mode or in the thickness shear mode. Also, the display of the present invention includes both of a digital display and an analogue display.

In this embodiment, though the facsimile apparatus is shown as an example of an electronic apparatus of the present invention, the present invention is not limited to this, namely, the present invention includes all electronic apparatus comprising a piezoelectric crystal resonator which constructs a piezoelectric crystal unit and a crystal oscillator, for example, cellular phones, wristwatches, facsimiles, cameras, TV sets, DVD recorders, i-Pods, video cameras, pagers, personal computers, printers, CD players, MD players, electronic musical instruments, car navigators, car electronics, timepieces, IC cards and so forth.

Thus, the electronic apparatus of the present invention comprising a piezoelectric crystal resonator may operate normally because a crystal oscillator is provided with the piezoelectric crystal resonator having a frequency of high stability and an output signal of the oscillator is very stable. In general, the electronic apparatus of the present invention comprises a display portion.

In addition, the piezoelectric crystal tuning fork resonator of the present invention is made of a piezoelectric material such as quartz crystal, lithium tantalite, lithium niobate and so forth which belong to a trigonal system in crystallographic classification.

In the above-embodiments, a groove having a plurality of stepped portions is formed in a central linear portion of each of the tuning fork tines, but, the present invention is not limited to this. For example, a plurality of grooves are formed in at least one of the first and second main surfaces of each of the tuning fork tines and at least two of the grooves does not have a central linear portion. In other words, the central linear portion is between the at least two grooves.

As above-described in detail, it will be easily understood that the piezoelectric crystal tuning fork resonator comprising three electrode terminals, according to the present invention, may have outstanding effects. Similar to this, the piezoelectric crystal unit and the crystal oscillator and the electronic apparatus, each of which comprises the piezoelectric crystal tuning fork resonator having the three electrode terminals, according to the present invention, may have also outstanding effects. In addition to this, while the present invention has been shown and described with reference to preferred embodiments thereof, it will be understood by those skilled in the art that the changes in shape and electrode construction can be made therein without departing from the spirit and scope of the present invention.

What is claimed is:

1. A piezoelectric crystal resonator comprising: a piezoelectric crystal tuning fork resonator capable of vibrating in a flexural mode of an inverse phase, the piezoelectric crystal tuning fork resonator comprising a tuning fork base and a plurality of tuning fork tines connected to the tuning fork base, the tuning fork tines having a first tuning fork tine and a second tuning fork tine, each of the tuning fork tines having a first main surface and a second main surface opposite the first main surface, and an inner side surface and an outer side surface opposite the inner side surface, at least one groove having a plurality of stepped portions being formed in at least one of the first and second main surfaces of each of the first and second tuning fork tines;

wherein a first electrode is disposed on at least one of the stepped portions of the at least one groove formed in at least one of the first and second main surfaces of each of the first and second tuning fork tines and a second electrode is disposed on at least one of the inner and outer side surfaces of each of the first and second tuning fork tines; and wherein one of the first electrode disposed on at least one of the stepped portions of the at least one groove formed in at least one of the first and second main surfaces of each of the first and second tuning fork tines and the second electrode disposed on at least one of the inner and outer side surfaces of each of the first and second tuning fork tines comprises an earth electrode that is grounded during use of the piezoelectric crystal resonator.

2. A piezoelectric crystal resonator according to claim 1; wherein the piezoelectric crystal tuning fork resonator comprises a quartz crystal tuning fork resonator.

3. A piezoelectric crystal resonator according to claim 1; wherein the second electrode is disposed on each of the inner and outer side surfaces of each of the first and second tuning fork tines; wherein the second electrode disposed on the inner side surface of the first tuning fork tine is connected to the second electrode disposed on the outer side surface of the first tuning fork tine; wherein the second electrode disposed on the inner side surface of the second tuning fork tine is connected to the second electrode disposed on the outer side surface of the second tuning fork tine; wherein the second electrode disposed on the inner side surface of the first tuning fork tine is connected to the second electrode disposed on the inner side surface of the second tuning fork tine; and wherein the second electrode disposed on each of the inner and outer side surfaces of each of the first and second tuning fork tines comprises the earth electrode.

4. A piezoelectric crystal resonator according to claim 3; wherein the second electrode disposed on each of the inner side surfaces of each of the first and second tuning fork tines extends on a surface of the tuning fork base.

5. A piezoelectric crystal resonator according to claim 3; wherein the first electrode is disposed on each of two of the stepped portions of the at least one groove formed in each of the first and second main surfaces of each of the first and second tuning fork tines; wherein the first electrode disposed on each of two of the stepped portions of the at least one groove in the first main surface of the first tuning fork tine is connected to the first electrode disposed on each of two of the stepped portions of the at least one groove in the second main surface of the first tuning fork tine; wherein the first electrode disposed on each of two of the stepped portions of the at least one groove in the first main surface of the second tuning fork tine is connected to the first electrode disposed on each of two of the stepped portions of the at least one groove in the second main surface of the second tuning fork tine; and wherein the first electrodes of the first tuning fork tine have an electrical polarity opposite to an electrical polarity of the first electrodes of the second tuning fork tine.

6. A piezoelectric crystal resonator according to claim 1; wherein the at least one groove formed in at least one of the first and second main surfaces of each of the first and second tuning fork tines comprises a through hole.

7. A piezoelectric crystal resonator according to claim 1; wherein the at least one groove formed in at least one of the first and second main surfaces of each of the first and second tuning fork tines comprises a groove having a plurality of stepped portions in each of the first and second main surfaces of each of the first and second tuning fork tines;

wherein the first electrode is disposed on each of two of the stepped portions of the groove formed in each of the first and second main surfaces of each of the first and second tuning fork tines; wherein the first electrode disposed on each of two of the stepped portions of the groove formed in the first main surface of the first tuning fork tine is connected to the first electrode disposed on each of two of the stepped portions of the groove formed in the second main surface of the first tuning fork tine; wherein the first electrode disposed on each of two of the stepped portions of the groove formed in the first main surface of the second tuning fork tine is connected to the first electrode disposed on each of two of the stepped portions of the groove formed in the second main surface of the second tuning fork tine; wherein the first electrode disposed on each of two of the stepped portions of the groove formed in each of the first and second main surfaces of the first tuning fork tine is connected to the first electrode disposed on each of two of the stepped portions of the groove formed in each of the first and second main surfaces of the second tuning fork tine; and wherein the first electrode disposed on each of two of the stepped portions of the groove formed in each of the first and second main surfaces of each of the first and second tuning fork tines comprises the earth electrode.

8. A piezoelectric crystal resonator according to claim 7; wherein the second electrode is disposed on each of the inner and outer side surfaces of each of the first and second tuning fork tines; wherein the second electrode disposed on the inner side surface of the first tuning fork tine is connected to the second electrode disposed on the outer side surface of the first tuning fork tine; wherein the second electrode disposed on the inner side surface of the second tuning fork tine is connected to the second electrode disposed on the outer side surface of the second tuning fork tine; and wherein the second electrodes of the first tuning fork tine have an electrical polarity opposite to an electrical polarity of the second electrodes of the second tuning fork tine.

9. A piezoelectric crystal unit comprising: a case having an open end; a lid for covering the open end of the case; and a piezoelectric crystal resonator disposed in the case, the piezoelectric crystal resonator comprising a piezoelectric crystal tuning fork resonator capable of vibrating in a flexural mode of an inverse phase, the piezoelectric crystal tuning fork resonator comprising a tuning fork base and a plurality of tuning fork tines connected to the tuning fork base, the tuning fork tines having a first tuning fork tine and a second tuning fork tine, each of the tuning fork tines having a first main surface and a second main surface opposite the first main surface, and an inner side surface and an outer side surface opposite the inner side surface, at least one groove having a plurality of stepped portions being formed in each of the first and second main surfaces of each of the first and second tuning fork tines;

wherein a first electrode is disposed on each of two of the stepped portions of the at least one groove formed in each of the first and second main surfaces of each of the first and second tuning fork tines and a second electrode is disposed on each of the inner and outer side surfaces of each of the first and second tuning fork tines; and wherein one of the first electrode disposed on each of two of the stepped portions of the at least one groove formed in each of the first and second main surfaces of each of the first and second tuning fork tines and the second electrode disposed on each of the inner and outer side surfaces of each of the first and second tuning fork tines comprises an earth electrode that is grounded during use of the piezoelectric crystal unit.

10. A piezoelectric crystal unit according to claim 9; wherein the second electrode disposed on the inner side surface of the first tuning fork tine is connected to the second electrode disposed on the outer side surface of the first tuning fork tine; wherein the second electrode disposed on the inner side surface of the second tuning fork tine is connected to the second electrode disposed on the outer side surface of the second tuning fork tine; wherein the second electrode disposed on the inner side surface of the first tuning fork tine is connected to the second electrode disposed on the inner side surface of the second tuning fork tine; and wherein the second electrode disposed on each of the inner and outer side surfaces of each of the first and second tuning fork tines comprises the earth electrode.

11. A piezoelectric crystal unit according to claim 10; wherein the first electrode disposed on each of two of the stepped portions of the at least one groove in the first main surface of the first tuning fork tine is connected to the first electrode disposed on each of two of the stepped portions of the at least one groove in the second main surface of the first tuning fork tine; wherein the first electrode disposed on each of two of the stepped portions of the at least one groove in the first main surface of the second tuning fork tine is connected to the first electrode disposed on each of two of the stepped portions of the at least one groove in the second main surface of the second tuning fork tine; and wherein the first electrodes of the first tuning fork tine have an electrical polarity opposite to an electrical polarity of the first electrodes of the second tuning fork tine.

12. A piezoelectric crystal unit according to claim 11; wherein the case has a first surface, a second surface and a third surface, an electrode being disposed on each of the first, second and third surfaces of the case; wherein a third electrode, a fourth electrode and a fifth electrode are disposed on a surface of the tuning fork base; wherein at least one of the first electrodes disposed on the stepped portions of the grooves formed in the first and second main surfaces of the first tuning fork tine is connected to the third electrode disposed on the surface of the tuning fork base; wherein the third electrode is connected to the electrode disposed on the first surface of the case; wherein at least one of the second electrodes disposed on the inner side surfaces of each of the first and second tuning fork tines is connected to the fourth electrode disposed on the surface of the tuning fork base; wherein the fourth electrode is connected to the electrode disposed on the second surface of the case; wherein at least one of the first electrodes disposed on the stepped portions of the grooves formed in the first and second main surfaces of the second tuning fork tine is connected to the fifth electrode disposed on the surface of the tuning fork base; and wherein the fifth electrode is connected to the electrode disposed on the third surface of the case.

13. A piezoelectric crystal unit according to claim 12; wherein the tuning fork base has opposite main surfaces; wherein the surface of the tuning fork base is the same as one of the opposite main surfaces.

14. A piezoelectric crystal unit according to claim 9; wherein the first electrode disposed on each of two of the stepped portions of the at least one groove formed in the first main surface of the first tuning fork tine is connected to the first electrode disposed on each of two of the stepped portions of the at least one groove formed in the second main surface of the first tuning fork tine; wherein the first electrode disposed on each of two of the stepped portions of the at least one groove formed in the first main surface of the second tuning fork tine is connected to the first electrode disposed on each of two of the stepped portions of the at least one groove formed in the second main surface of the second tuning fork tine; and wherein the first electrode disposed on each of two of the stepped portions of the at least one groove formed in each of the first and second main surfaces of each of the first and second tuning fork tines comprises the earth electrode.

15. A piezoelectric crystal unit according to claim 14; wherein the second electrode disposed on the inner side surface of the first tuning fork tine is connected to the second electrode disposed on the outer side surface of the first tuning fork tine; wherein the second electrode disposed on the inner side surface of the second tuning fork tine is connected to the second electrode disposed on the outer side surface of the second tuning fork tine; and wherein the second electrodes of the first tuning fork tine have an electrical polarity opposite to an electrical polarity of the second electrodes of the second tuning fork tine.

16. An electronic apparatus comprising: an oscillator comprising an oscillating circuit having a piezoelectric crystal resonator, an amplifier, a plurality of capacitors and at least one resistor; and a piezoelectric crystal unit comprising a case having an open end, a lid for covering an open end of the case, and a piezoelectric crystal resonator disposed in the case, the piezoelectric crystal resonator comprising a piezoelectric crystal tuning fork resonator capable of vibrating in a flexural mode of an inverse phase, the piezoelectric crystal tuning fork resonator comprising a tuning fork base and a plurality of tuning fork tines connected to the tuning fork base, the tuning fork tines having a first tuning fork tine and a second tuning fork tine, each of the tuning fork tines having a first main surface and a second main surface opposite the first main surface, and an inner side surface and an outer side surface opposite the inner side surface, at least one groove having a plurality of stepped portions being formed in each of the first and second main surfaces of each of the first and second tuning fork tines;

wherein a first electrode is disposed on each of two of the stepped portions of the at least one groove formed in each of the first and second main surfaces of each of the first and second tuning fork tines and a second electrode is disposed on each of the inner and outer side surfaces of each of the first and second tuning fork tines; and wherein one of the first electrode disposed on each of two of the stepped portions of the at least one groove formed in each of the first and second main surfaces of each of the first and second tuning fork tines and the second electrode disposed on each of the inner and outer side surfaces of each of the first and second tuning fork tines comprises an earth electrode that is grounded during use of the electronic apparatus.

17. An electronic apparatus according to claim 16; wherein the oscillating circuit comprises an amplification circuit having a CMOS inverter and a feedback resistor and a feedback circuit having the piezoelectric crystal tuning fork resonator, the capacitors and a drain resistor; and wherein the piezoelectric crystal tuning fork resonator is electrically connected to the CMOS inverter and the feedback resistor of the amplification circuit and to the capacitors and the drain resistor of the feedback circuit.

18. An electronic apparatus according to claim 16; wherein the second electrode disposed on the inner side surface of the first tuning fork tine is connected to the second electrode disposed on the outer side surface of the first tuning fork tine; wherein the second electrode disposed on the inner side surface of the second tuning fork tine is connected to the second electrode disposed on the outer side surface of the second tuning fork tine; wherein the second electrode disposed on the inner side surface of the first tuning fork tine is connected to the second electrode disposed on the inner side surface of the second tuning fork tine; and wherein the second electrode disposed on each of the inner and outer side surfaces of each of the first and second tuning fork tines comprises the earth electrode.

19. An electronic apparatus according to claim 18; wherein the first electrode disposed on each of two of the stepped portions of the at least one groove in the first main surface of the first tuning fork tine is connected to the first electrode disposed on each of two of the stepped portions of the at least one groove in the second main surface of the first tuning fork tine; wherein the first electrode disposed on each of two of the stepped portions of the at least one groove in the first main surface of the second tuning fork tine is connected to the first electrode disposed on each of two of the stepped portions of the at least one groove in the second main surface of the second tuning fork tine; and wherein the first electrodes of the first tuning fork tine have an electrical polarity opposite to an electrical polarity of the first electrodes of the second tuning fork tine.

20. An electronic apparatus according to claim 16; wherein the first electrode disposed on each of two of the stepped portions of the at least one groove formed in the first main surface of the first tuning fork tine is connected to the first electrode disposed on each of two of the stepped portions of the at least one groove formed in the second main surface of the first tuning fork tine; wherein the first electrode disposed on each of two of the stepped portions of the at least one groove formed in the first main surface of the second tuning fork tine is connected to the first electrode disposed on each of two of the stepped portions of the at least one groove formed in the second main surface of the second tuning fork tine; and wherein the first electrode disposed on each of two of the stepped portions of the at least one groove formed in each of the first and second main surfaces of each of the first and second tuning fork tines comprises the earth electrode connected to the earth; wherein the second electrode disposed on the inner side surface of the first tuning fork tine is connected to the second electrode disposed on the outer side surface of the first tuning fork tine; wherein the second electrode disposed on the inner side surface of the second tuning fork tine is connected to the second electrode disposed on the outer side surface of the second tuning fork tine; and wherein the second electrodes of the first tuning fork tine have an electrical polarity opposite to an electrical polarity of the second electrodes of the second tuning fork tine.

* * * * *